US006888773B2

(12) United States Patent
Morimoto

(10) Patent No.: US 6,888,773 B2
(45) Date of Patent: May 3, 2005

(54) SEMICONDUCTOR MEMORY DEVICE AND ERASE METHOD FOR MEMORY ARRAY

(75) Inventor: Hidenori Morimoto, Kashihara (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 0 days.

(21) Appl. No.: 10/729,735

(22) Filed: Dec. 5, 2003

(65) Prior Publication Data

US 2004/0114438 A1 Jun. 17, 2004

(30) Foreign Application Priority Data

Dec. 5, 2002 (JP) ........................................ 2002-353732

(51) Int. Cl.⁷ ................................................ G11C 7/00
(52) U.S. Cl. ........................................ 365/218; 365/148
(58) Field of Search ........................... 365/185.29, 218, 365/148, 100

(56) References Cited

U.S. PATENT DOCUMENTS 5,831,905 A    11/1998  Hirano
6,542,410 B2 *  4/2003  Hirano ..................... 365/185.3

FOREIGN PATENT DOCUMENTS

JP          9-320282      12/1997

\* cited by examiner

Primary Examiner—Thong Q. Le
(74) Attorney, Agent, or Firm—Morrison & Foerster LLP

(57) ABSTRACT

An object of the invention is to provide a nonvolatile semiconductor memory device and an erase method for a memory cell array that have high degree of freedom and that are capable of quickly and securely implementing data erase and reprogramming. In a memory cell array, memory cells each configured of a variable resistor element for storing information through variations in electric resistance and a selected transistor are arranged in a matrix, and word lines (WL1, . . . , WLm) and bit lines (BL1, . . . , BLn) are arranged to select a predetermined memory cell. For the memory cell array, erase means is provided that sets the electric resistance of the variable resistor element to a predetermined erased state by applying voltage under a predetermined application condition to the word line (WL), bit line (BL), and source line (SL). The erase means switches between a batch-erase mode and an individual-erase mode. The batch-erase mode is used to perform batch erase of all the memory cells in the memory cell array, and the individual-erase mode is used to perform individual erase of a part of the memory cells in the memory cell array.

14 Claims, 11 Drawing Sheets

SEMICONDUCTOR MEMORY DEVICE AND ERASE METHOD FOR MEMORY ARRAY

BACKGROUND OF THE INVENTION

1. Field of the Invention

The present invention relates to a semiconductor memory device that has a single or a plurality of memory cell arrays each configured such that a plurality of nonvolatile memory cells are arranged in each of a row direction and column direction, and a plurality of word lines and a plurality of bit lines are arranged in each of the row direction and column direction to select a predetermined memory cell or predetermined memory cells from the plurality of memory cells. More specifically, the present invention relates to an erase method for a memory cell array using variable resistor elements as memory bearers.

2. Description of the Related Art

Recent semiconductor memory devices are in a fast-growing field. Especially, flash memories can be electrically reprogrammed, and data once programmed therein are not erased even after power-off. Because of these features, flash memories are used with easy-to-carry memory cards and cellular phones, wherein they exhibit functions as, for example, data storage and program storage for non-volatilely storing data of device-operation initialization.

As memory cells of a flash memory, ETOX (registered trademark of Intel Corp., USA) type memory cells are known. As shown in FIG. 9, an ETOX type cell is configured such that a source 3 and a drain 2 is formed in a semiconductor substrate 1, and the source 3 and the drain 2 have a polarity opposite to the semiconductor substrate 1. In source-drain region, a gate insulation film 4 is formed; and further, a floating gate 5, an interlayer insulation film 6, and a control gate 7 are formed thereon.

According to the principles of operation of the ETOX type cell 10, in a data-program mode, ordinarily a low voltage (0V, for example) is applied as a source voltage Vs to the source 3, a drain voltage Vd (6V, for example) is applied to the drain 2, and a high voltage Vp (12V, for example) is applied to a control gate 7. At this time, hot electrons and hot holes are generated in a drain-source region. The hot holes flow as substrate currents into the substrate. The hot electrons are injected into the floating gate, thereby a threshold voltage as viewed from the control gate 7 is increased.

In a read mode, a low voltage (0V, for example) is applied as a source voltage to the source 3; a drain voltage (1V, for example), which is slightly higher than the source voltage, is applied to the drain; and a voltage of 5V is applied to the control gate 7. At this time, thresholds of a programmed cell and unprogrammed cell are different from each other, so that depending on the cell, there occurs a difference in the current flowing into the drain-source region. The difference is sensed for state determination. As a result, a state where the current is larger than a predetermined current is determined to be "1" (erased cell), and a state where the current is smaller than the predetermined current is determined to be as "0" (programmed cell).

In the erase mode, a high voltage Vpp (12V, for example) is applied to the source 3, a low voltage (0V, for example) is applied to the control gate 7, and the drain is maintained in a floating state. Thereby, a Fowler-Nordheim current flows to a floating gate-source region via a tunnel oxide layer 4, thereby causing electrons to be removed from the floating gate 5.

According to the operational principles described above, verify is performed whether cells to be programmed and erased are each in the state higher than the predetermined threshold or lower than the predetermined threshold. In program verify, a cell of interest is compared with a cell (reference cell) set to a high threshold (Vthp) (5.3V, for example). As a result, if the threshold of the cell of interest is higher than the reference cell threshold, the cell is determined as a programmed cell. In erase verify, a cell of interest is compared with a cell (reference cell) set to a low threshold (Vthe) (3.1V, for example). As a result, if the threshold of the cell of interest is lower than the reference cell threshold, the cell is determined to be an erase cell.

FIG. 10 is a configuration view of a source-common memory cell array section used in a conventional example of the flash memory. Address signals are input to a word decoder 11, data and address signals are input to a column decoder 12, and an erase signal is input to an erase circuit 13. This chip has m word lines WL1, ..., WLm (m=2,048, for example), wherein control gates of n memory cells MC (n=512, for example) are connected to each one of the word lines. As such, the chip has n bit lines BL1, ..., BLn. That is, the memory capacity of the memory is m×n pieces (1 Mb, for example). The source of the memory cell array is common, and a common source line SL is connected to the erase circuit 13. In the erase mode, an erase signal is input to the erase circuit 13; and as shown in FIG. 10, Vpp is applied to the sources of memory cell transistors arranged in an array, whereby all the cells can be erased at the same time.

In a practical device, erase is performed in units of a block, of which size is as relatively as large as 64 Kb, for example. In addition, a block to be erased contains memory cells having thresholds in programmed states and erased states, so that erase needs to be performed using a complex algorithm such as that shown in FIG. 11.

An erase method shown in FIG. 11 will be described hereinbelow. Upon the start of erase, a regular program operation (technique using CHE (channel hot electron)) is first performed to set all memory cells of one block to a programmed state (step S1). Program verify is then performed in units of, for example, eight bits, to verify whether thresholds of the memory cells programmed in step S1 are higher than 5.5V (step S2). If the thresholds of the memory cells are not higher than 5.5V, the processing returns to step S1 and continues programming. On the other hand, if the memory cell thresholds become higher than 5.5V, the processing proceeds to step S3. At step S3, erase pulses are applied in batch to the block. The erase is performed in such a manner that electrons are removed from the source side to lower the memory cell threshold. Then, at step S4, erase verify is performed to verify whether the thresholds of all the memory cells of the block are lower than 3.5V. If the memory cell thresholds are not lower than 3.5V, the processing returns to step S3 and continues erase. On the other hand, if the memory cell thresholds become lower than 3.5V, the processing terminates the erase.

As can be seen from the erase method shown in FIG. 11, all the cells are first processed to a programmed state in the manner that post-erase threshold distributions are tightened as much as possible; that is, the distribution widths are narrowed, and concurrently, an over-erased cells (cells whose thresholds becomes 0V or lower) is avoided. In this case, eight memory cells can be performed at the same time through regular program operations. When the programming time for one cell is assumed to be 2 μs, the time required for the program operations is 131 msec, as shown in expression (1) given below.

$$2\ \mu s \times 64\ Kb \div 8 = 131\ msec \quad (1)$$

Assuming that an erase total time is 600 msec, the time for the program operations accounts for about 20% of the total time. For the verify at step S2, when the verify operations are performed with a per-cell verify time of 100 nanoseconds (ns) in units of eight bits, the verify time is about 6.6 ms, as shown in equation (2) below. For the erase pulse application of step S3, about a time of 300 msec is required.

$$100\ ns \times 64\ Kb \div 8 = 6.6\ msec \quad (2)$$

For the erase method shown in FIG. 11, as a method of reducing the total time of pulse application, it is contemplated to increase the source application time in the event of erase pulse application. However, when the source voltage is increased, inter-band tunneling current is also increased, so that holes are trapped into the tunnel oxide layer, thereby leading to deterioration of reliability. For this reason, the source voltage cannot be increased higher than a given level, and hence the erase speed also cannot be enhanced.

A cellular phone is a representative example of application devices using a flash memory of the type described. Under conditions that force a device to use a power source with a significant capacity limitation placed to meet very strong miniaturization requirements as those for a cellular phone, a flash memory is suitable as it has the characteristic of nonvolatility that does not require a backup battery for information retention purposes even in a long standby time. In addition, because of increase in the storage capacity of the flash memory itself, the flash memory is capable of storing a large number of applications and a large amount of data and executing them by switching there among, thereby contributing to implementation of multi-functions of the cellular phone.

In the field of nonvolatile semiconductor memory devices of the type described above, there is a trend that application program and data themselves are increased in number and/or amount. In the future, it would be expected that a system capable of reprogramming software stored into a flash memory be put into practical use and the system be enabled to implement bug correction and/or functional upgrading. Under these circumstances, as in the case of the flash memory, with the semiconductor storage device that requires batch erase to be preliminarily performed to reprogram a file of program data and/or like, problems arise in that it takes a very long time for reprogramming. In addition, undue or superfluous storage capacity needs to be preserved for temporary buffering files. These things make procedures to be complex.

SUMMARY OF THE INVENTION

The present invention is made in view of the problems described above. Accordingly, it is an object of the invention is to provide a nonvolatile semiconductor memory device and an erase method for a memory cell array that have high degree of freedom and that are capable of quickly and securely implementing data erase and reprogramming.

In order to achieve the object described above, a feature configuration of a semiconductor memory device according to the present invention comprises a single or a plurality of memory cell arrays and erase means wherein the memory cell array is configured such that a plurality of nonvolatile memory cells each comprising a variable resistor element for storing information through variations in electric resistance are arranged in each of a row direction and a column direction, and a plurality of word lines and a plurality of bit lines are arranged along the row direction and the column direction, respectively, to select a predetermined memory cell or memory cells from the plurality of memory cells; the memory cells are arranged such that one end sides of the variable resistor elements are individually connected to drains of selection transistors, the other end sides of the variable resistor elements or sources of the selection transistors are commonly connected to the bit lines along the column direction, the others thereof are commonly connected to the source line, and gates of the selection transistors are commonly connected to the word lines along the row direction; and the erase means is configured to apply voltage individually to each of the word lines, the bit cells, and the source line that are connected to the memory cell array under predetermined application conditions, to set the electric resistances of the variable resistor elements in individual erase-target memory cells in the memory cell array to a predetermined erased state, and to thereby render the information in the memory cells to be erasable; and concurrently, the erase means executes the erase by switching between a batch-erase mode and an individual-erase mode depending on the voltage application conditions in at least one of the memory cell arrays, wherein in the batch-erase mode the erase means performs batch erase of all the memory cells in the memory cell array, and in the individual-erase mode the erase means performs individual erase of a part of the memory cells in the memory cell array.

Thus, the configuration is arranged so that the erase mode can be switched depending on the voltage application condition. For example, the batch-erase mode can be used in a case where program data or the like are to be stored into the memory cells formed in the memory cell array and the data are to be reprogrammed in batch. Alternatively, for example, the individual-erase mode can be used in a case where code data or the like are to be stored into the memory cells formed in the memory cell array, and the code data are to be individually reprogrammed. Accordingly, the memory cell array can be efficiently used corresponding to the characteristics of data to be stored in the memory cells.

The erase means is configured such that, for at least one of the memory cell arrays, all the memory cells in the memory cell array are rendered to be erasable in batch by setting the voltage application conditions to the application condition of the batch-erase mode. In addition, the erase means is configured such that, for at least the other one of the memory cell arrays, a part of the memory cells in the memory cell array is rendered to be individually erasable by setting the voltage application conditions to the application condition of the individual-erase mode. In this case, since the erase mode can be switched between the batch-erase mode and the individual-erase mode in units of the memory cell array, the memory cell array can be efficiently used corresponding to the characteristics of data to be stored in the memory cells.

The application conditions of the batch-erase mode and the individual-erase mode are determined by setting voltage values that are to be applied to each of the word lines, the bit lines, and the source line.

In the batch-erase mode, for all the memory cells in the memory cell array, the erase means performs operation such that after voltage application is performed under the application condition of the batch-erase mode, a determination is performed whether the individual memory cells have been erased; and if all the memory cells are erased in units of the word line in the row direction, the operation terminates the voltage application in progress to the word lines under the application condition of the batch-erase mode; and for memory cells not having undergone the erase of all the memory cells in units of the word line in the row direction, the voltage application under the application condition of the batch-erase mode and the determination are iterated for the word lines until all the memory cells are erased in units of the word line in the row direction. In this case, when data of all the memory cells are erased in units of the word line in the row direction are erased, a problem of, for example, increasing a program time until the resistance value reaches a predetermined resistance value can be prevented by reducing the resistance value to be lower than necessary for the variable resistor element when performing programming of data. That is, while the resistance value of the variable resistor element of each of the memory cell is being maintained to be uniform, nonuniformity in the program time until the resistance value reaches the predetermined resistance value can be reduced when performing the programming of data. For this reason, the configuration described above is preferable.

The semiconductor memory device is configured to comprise program means for performing operation such that voltages is applied individually under a predetermined application condition to each of the word lines in the memory cell array, the bit lines, and the source line that are to be connected to program-target memory cells, the electric resistances of the variable resistor elements in the program-target memory cells are set to a predetermined programmed state, and the information are programmed into the individual memory cells, wherein in the batch-erase mode, before the erase means applies the voltage under the application condition of the batch-erase mode to all the memory cells in the memory cell array, the program means performs a program operation so that the electric resistances of the variable resistor elements are set consistent to a predetermined programmed state for all the memory cells. In this case, by performing the erase operation in the batch-erase mode after all the memory cells are once set to a high resistance state, nonuniformity in the resistance value can be reduced even while erase-event power consumption is being reduced by preventing abnormal current from flowing to a memory cell that is unprogrammed and that has a small resistance value.

In the individual-erase mode, for an erase-target memory cell in the memory cells in the memory cell array, the erase means performs operation such that after voltage application is performed under the application condition of the individual-erase mode, a determination is performed whether the memory cell has been erased; for the memory cell erased, the operation terminates the voltage application in progress under the application condition of the individual-erase mode to at least one of the word line and the bit line; and for memory cells not erased, the voltage application in the application condition of the individual-erase mode and the determination are iterated until the memory cells are erased in units of the memory cell. The erase means configured to implement the above operation is preferable from the viewpoint of implementing reduction in the nonuniformity of the erase-event resistance value in the individual-erase mode.

In view of the above, a feature configuration of an erase method for a memory cell array according to the present invention comprises a batch-erase mode and a individual-erase mode, wherein the batch-erase mode is used to perform to batch erase of all the memory cells in the memory cell array in units of the memory cell array, and the individual-erase mode is used to perform individual erase of a part of the memory cells in the memory cell array, wherein in each the batch-erase mode and the individual-erase mode, the erase method applies voltage under application conditions to each of the word lines, the bit cells, and the source line that are connected to the memory cell array, sets the electric resistances of the variable resistor elements in individual erase-target memory cells in the memory cells in the memory cell array to a predetermined erased state, and thereby erases the information in the memory cells; and the application condition of the batch-erase mode and the application condition of the individual-erase mode are different in an application condition at least for one of the word line, the bit line, and the source line.

Preferably, in the batch-erase mode, for all the memory cells in the memory cell array, the erase method performs operation such that after voltage application is performed under the application condition of the batch-erase mode, a determination is performed whether the individual memory cells have been erased; and if all the memory cells are erased in units of the word line in the row direction, the operation terminates the voltage application in progress under the application condition of the batch-erase mode; and for memory cells not having undergone the erase of all the memory cells in units of the word line in the row direction, the voltage application under the application condition of the batch-erase mode and the determination are iterated for the word lines until all the memory cells are erased in units of the word line in the row direction. This is preferable to reduce nonuniformity in the resistance value of the variable resistor element constituting the memory cell. In addition, preferably, before applying the voltage under the application condition of the batch-erase mode to all the memory cells in the memory cell array, the erase method applies the voltage to the word lines, the bit lines, and the source line which are connected to the memory array under the individual application conditions, and performs a program operation so that the electric resistances of the variable resistor elements are set consistent to a predetermined programmed state for all the memory cells. This is preferable from the viewpoint similar to the above.

Preferably, in the individual-erase mode, for an erase-target memory cell in the memory cells in the memory cell array, the erase method performs operation such that after voltage application is performed under the application condition of the individual-erase mode, a determination is performed whether the memory cell has been erased; for the memory cell erased, the operation terminates the voltage application in progress under the application condition of the individual-erase mode to at least one of the word line and the bit line; and for memory cells not erased, the voltage application in the application condition of the individual-erase mode and the determination are iterated until the memory cells are erased in units of the memory cell. This is preferable to reduce nonuniformity in the resistance value of the variable resistor element constituting the memory cell.

DETAILED DESCRIPTION OF THE INVENTION

Embodiments of a semiconductor memory device and an erase method for a memory cell array according to the present invention will be described with reference to the accompanying drawings.

Figure 1:
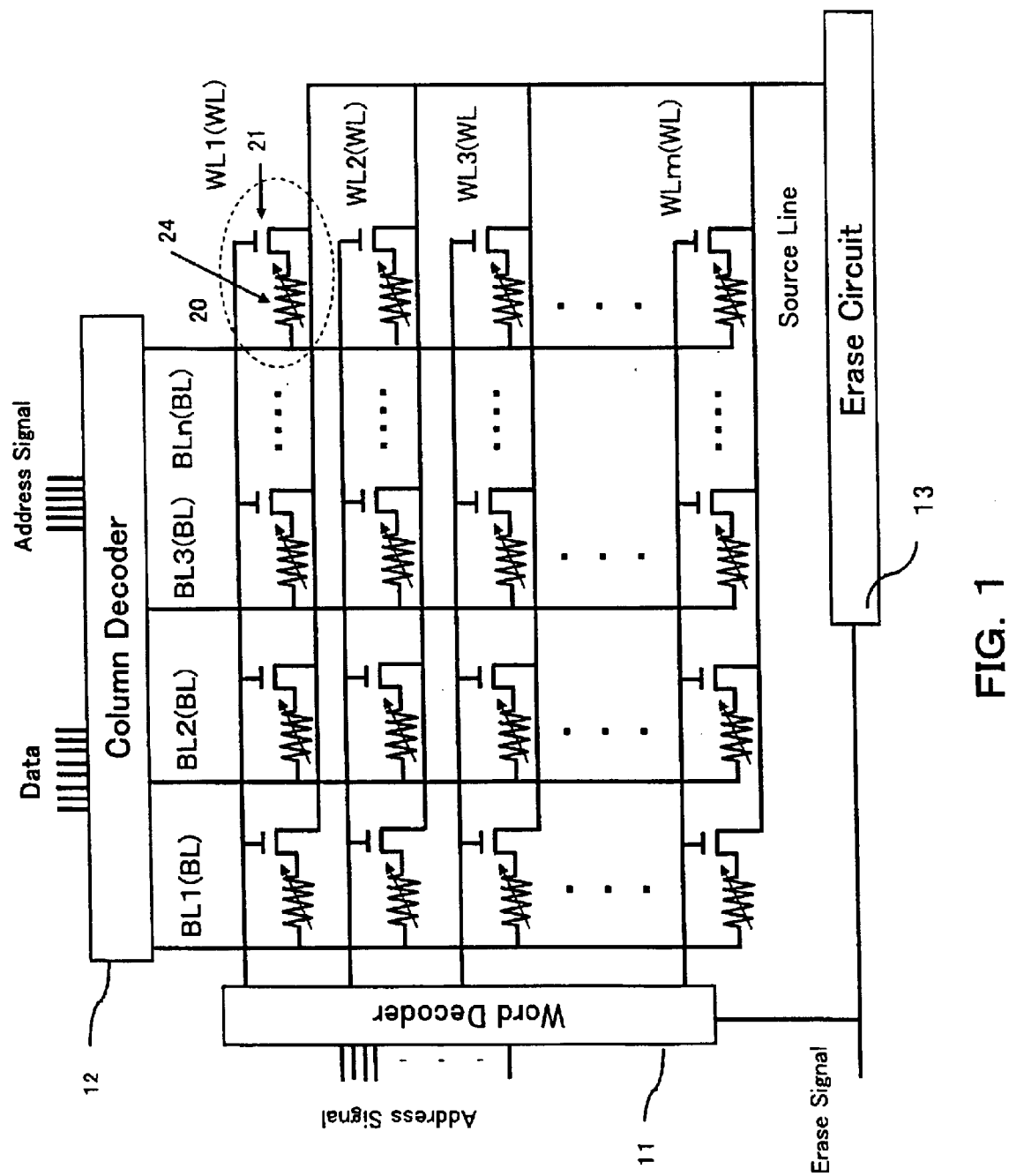
FIG. 1 is a configuration view of a memory cell array section configured by using variable resistor elements that are to be used in the present invention.

Referring to FIG. 1, the semiconductor memory device of the present invention has a single or a plurality of memory cell arrays each configured as described hereunder. A plurality of nonvolatile memory cells 20 are arranged in each of a row direction and column direction, and a plurality of word lines WL1, . . . , WLm and a plurality of bit lines BL1, . . . , BLn are arranged in each of the row direction and column direction to select a predetermined memory cell or predetermined memory cells from the plurality of memory cells 20.

The memory cells 20 are arranged as follows. One end sides of variable resistor elements 24 for storing information by using variations in electric resistance are connected to drains of selection transistors 21. In the memory cell array, the other end sides of the variable resistor elements 24 or sources of the selection transistors 21 are commonly connected to the bit lines BL along the column direction, the others thereof are commonly connected to the source line SL, and gates of the selection transistors 21 are commonly connected to the word lines WL along the row direction.

Further provided is an erase circuit 13 working as erase means that erases the information in the memory cells by applying voltage to the individual word lines WL, bit lines BL, and source line SL under a predetermined application condition to set electric resistances in the variable resistor elements of erase-target memory cells in the memory cells in the memory cell array to a predetermined erased state.

The erase circuit 13 is configured to switch between a batch-erase mode and an individual-erase mode depending on the application condition of the voltage in at least one of the memory cell arrays. In the batch-erase mode, the erase circuit 13 performs batch erase of all the memory cells in the memory cell array. In the individual-erase mode, the erase circuit 13 performs individual erase of a part of the memory cells in the memory cell array.

Figure 2:
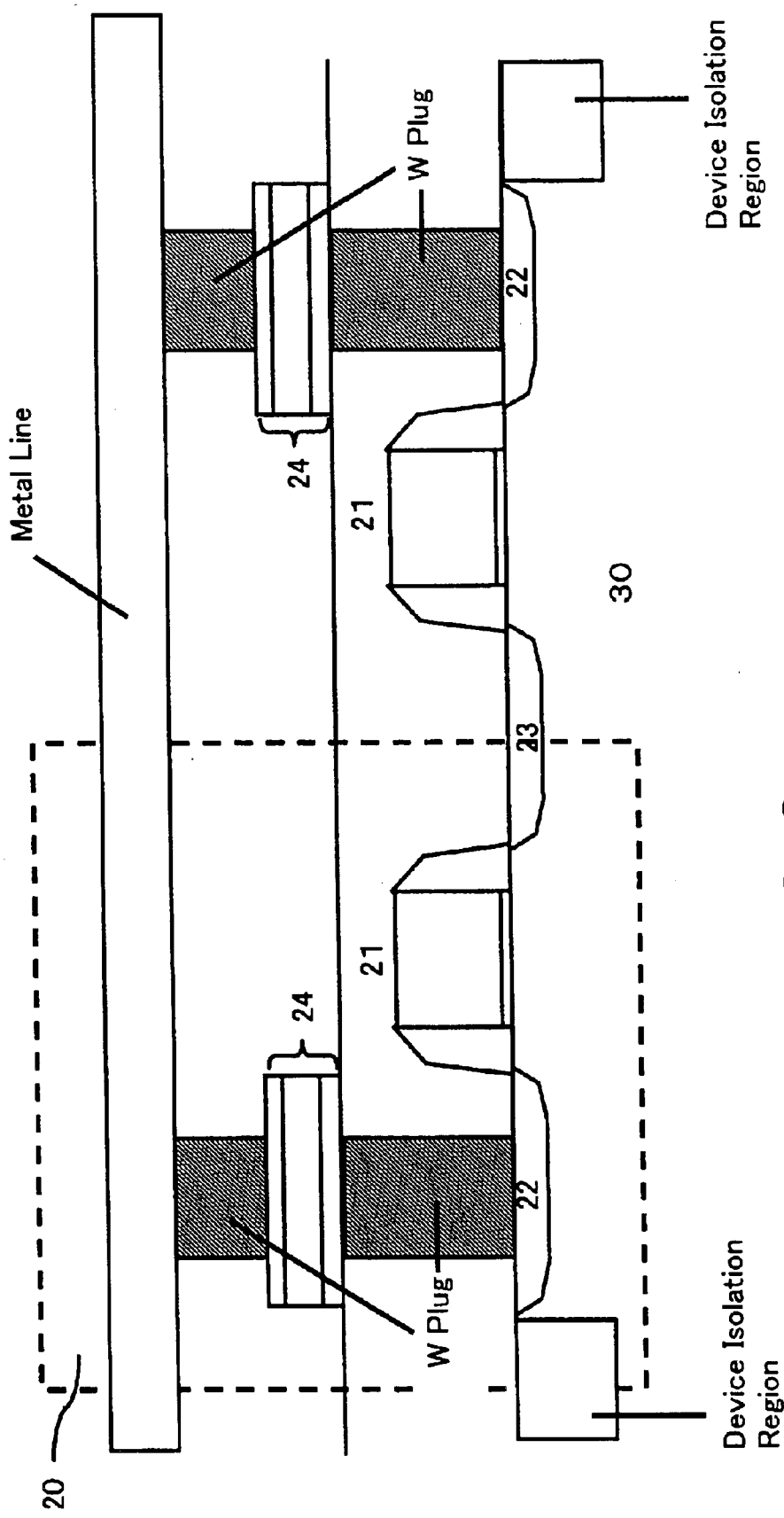
FIG. 2 is a schematic view showing cross section of memory cells each using the variable resistor element that are to be used in the present invention.
Figure 3:
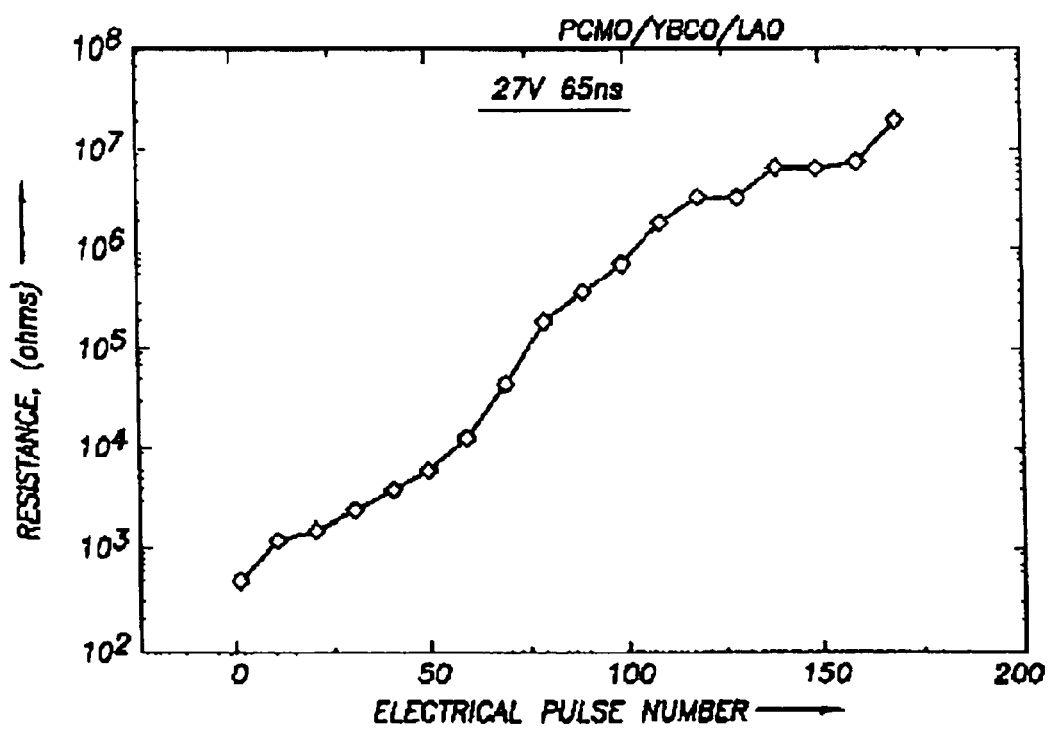
FIG. 3 is a graph showing characteristics of the variable resistor element to be used in the present invention.

In more detail, with reference to FIG. 2, the source-common memory cells 20 used in the present invention are each configured of the selection transistor 21, which is formed in a region isolated via an element isolation region on a semiconductor substrate 30, and the variable resistor element 24, which is connected to a drain region 22 of the selection transistor 21. A source region 23 of the selection transistor 21 is shared by the adjacent memory cell 20. For example, as shown in FIG. 3, the variable resistor element 24 has characteristics that continually vary the resistance value corresponding to the number of voltage pulse applications, that vary the electric resistance with electrical stresses, and that retain the varied electric resistance even after the electrical stresses have been relieved. The variable resistor element 24 is formed by a manganese oxide film of any one of, represented by, for example, $Pr_{(1-x)}Ca_xMnO_3$, $La_{(1-x)}Ca_xMnO_3$, $La_{(1-x-y)}Ca_xPb_yMnO_3$ (where, x<1, y<1, and x+y<1), $Sr_2FeMnO_6$, and $Sr_2FeWO_6$, of which examples are $Pr_{0.7}Ca_{0.3}MnO_3$, $La_{0.65}Ca_{0.35}MnO_3$, and $La_{0.65}Ca_{0.175}Pb_{0.175}MnO_3$, by using a process such as MOCVD method (metal-organic chemical vapor deposition), spin coating method, laser abrasion, or sputtering method. The program time for programming data into the variable resistor element 24 is several tens of nano seconds to 200 nano seconds, so that the variable resistor element 24 is higher in program speed than flash memories. Further, the variable resistor element 24 is also capable of performing erase with application of a reverse polarity voltage for several tens of nano seconds to 200 nano seconds. As such, the variable resistor element 24 is significantly higher in programming and erase speeds than flash memories.

In the Specification, hereinbelow, "increasing the resistance value" of the RRAM element will be expressed using the word "program" and variations thereof. Description will be provided hereinbelow assuming the following normal operation cases. To perform programming, the selection transistor is turned on, whereby a voltage of 5V is applied to the bit line BL, and a voltage of 0V is applied to the source line SL. Conversely, to perform erase, the selection transistor is turned on, whereby a reverse polarity voltage is applied to the bit line BL. To perform read, the selection transistor is turned on, whereby a voltage (2V, for example) lower than the program voltage is applied to the bit line BL, and a voltage of 0V is applied to the source line SL. However, since the memory device is configured to switchably supply individual voltages through a voltage generation circuit, the voltage values are not limited to the values mentioned above, but may be appropriately set to be suitable for the characteristics of the nonvolatile variable resistor element. More specifically, referring to FIG. 4(a), in a state where the source line SL is set to a low voltage (ground potential, for example), programming of data into the memory cell 20 is performed by applying a voltage of, for example, 3V to a word line WL for a selected cell, a voltage of, for example, 5V to a bit line BL, and by setting a non-selected word line WL and bit line BL to 0V. Thereby, a selected transistor is conducted only to the selected cell, and the voltage is applied to both ends of the resistor element, so that the resistance value of the selected cell increases. To verify whether the resistance value has reached a predetermined value for the programmed memory cell, program verify is performed to compare the predetermined value with a current flowed by, for example, a differential amplifier circuit (not shown) to the selected memory cell or the voltage applied to the selected memory cell and concurrently, the program voltage is applied until the resistance value reaches the predetermined resistance value and the verify is iterated. Meanwhile, the voltage to be applied to the word line WL may be any level as long as the voltage is higher than or equal to an on-voltage of the selected transistor.

To perform read, a voltage of 3V, for example, is applied to the word line WL, and a voltage (2V, for example) lower than the program voltage is applied to the bit line BL, and a voltage of 0V is applied to the source line SL. At this time, since the resistance values are different in the programmed cell and non-programmed cell, so that there occurs a difference in the current flowing into the drain-source region. The difference is sensed by, for example, a differential amplifier circuit for state determination. As a result, a state where the current is larger than a predetermined current is determined to be "0", and a state where the current is smaller than the predetermined current is determined to be as "1".

The erase circuit 13 is configured to switch between the batch-erase mode and the individual-erase mode depending on the application conditions of the voltage in at least one of the memory cell arrays. In the batch-erase mode, the erase circuit 13 performs batch erase of all the memory cells in the memory cell array. In the individual-erase mode, the erase circuit 13 performs individual erase of a part of the memory cells in the memory cell array.

Figure 4:
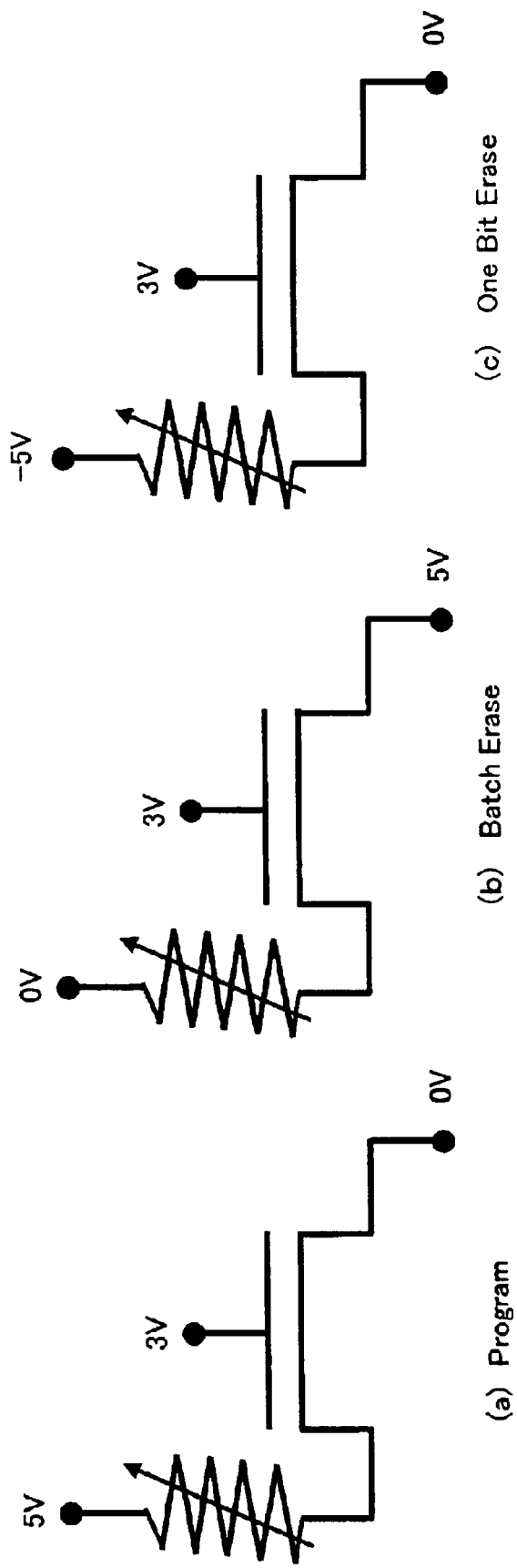
FIGS. 4A, 4B, and 4C are schematic views each showing voltage conditions of programming and erasion of a memory cell using the variable resistor element that is to be used in the present invention.

With reference to FIG. 4(b), in the batch-erase mode, in the single or the plurality of memory cell arrays, an erase pulse of 5V, for example, is applied to the source lines SL; an erase pulse of 3V, for example, is applied to the word lines WL; and an erase pulse of 0V, for example, is applied to the bit lines BL. In this voltage applied state, reverse polarity voltages with respect to those in the program operation shown in FIG. 4(a) are applied, whereby the resistance values of the variable resistor elements are reduced. In addition, in the batch-erase mode, for all the memory cells 20 in the memory cell array, after voltage application is performed under an application condition of the batch-erase mode, a determination is performed whether the individual memory cells have been erased. If all the memory cells are erased in units of the word line in the row direction, the processing terminates the voltage application in progress under the application condition of the batch-erase mode. In the event that there are memory cells not having undergone the erase of all the memory cells in units of the word line in the row direction, the voltage application in the application condition of the batch-erase mode and the determination are iterated for the word lines until all the memory cells are erased in units of the word line in the row direction.

Figure 5:
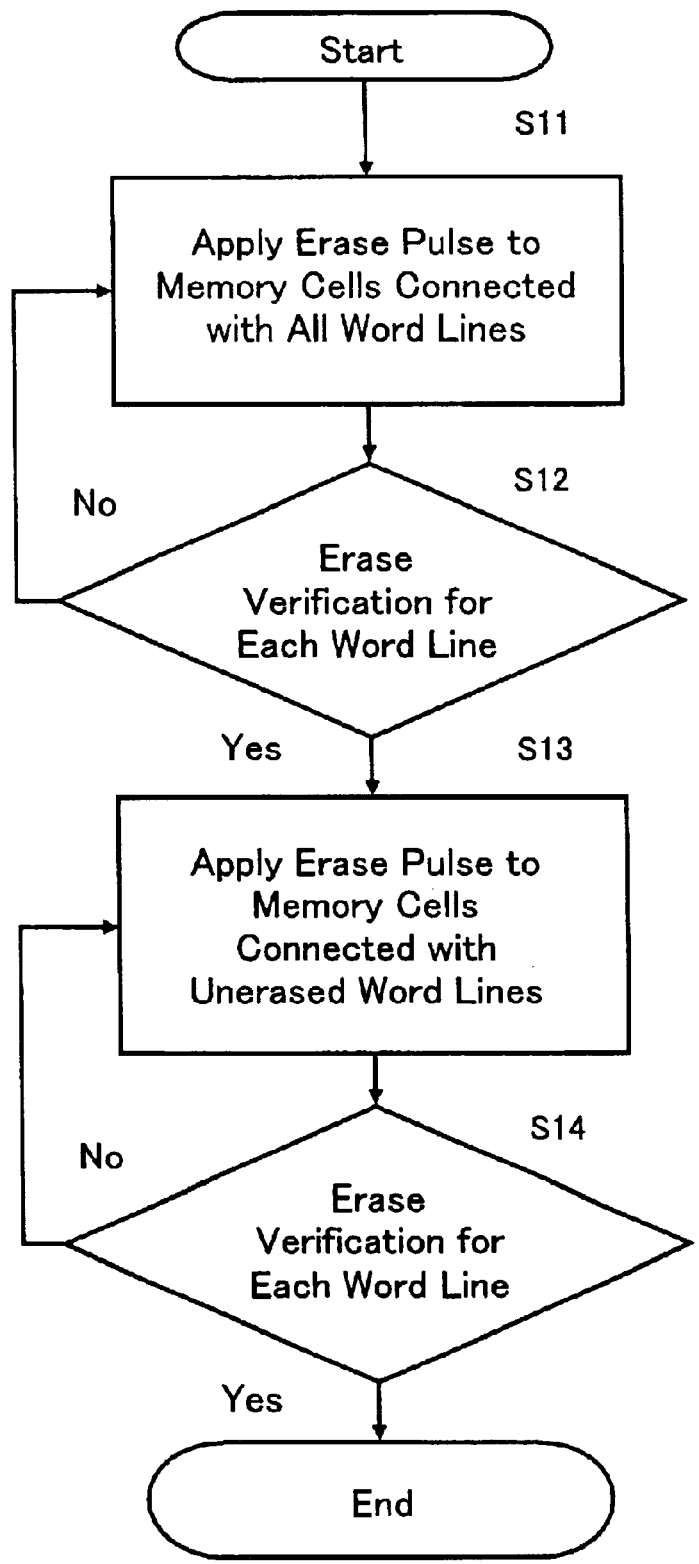
FIG. 5 is a flowchart of an erase method of the memory cell array configured by using the variable resistor elements that are to be used in the present invention.

With reference to FIG. 5, in the batch-erase mode, an erase pulse is applied under the condition shown in FIG. 4(a) (S11), and erase verify is performed to verify whether the resistance values of selected memory cells are lower than a predetermined resistance value (S12). If all the memory cells in units of the word line in the row direction are erased, voltage application is stopped for the word line WL or word lines WL, the voltage is applied to other word line WL or word lines WL, and source line SL and partial erase is performed (S13). If the variable resistor elements 24 of all the memory cells become lower than the predetermined resistance value (S14), the erase is completed. When the erase is performed for a 64 Kb memory capacity, the erase time is 50 nano seconds; and if the verify is the same as that in a flash memory, the time is 6.6 msec, which is substantially a verify time of 6.6 msec. In the above processing, steps S11 and S12 may be iterated until the variable resistor elements 24 of all the memory cells become lower than the predetermined resistance value. In this case, however, erase operations are continually executed even on memory cells of which resistance values have already become lower than the predetermined resistance value, so that undue or unnecessary power is consumed. Concurrently, since the resistance values are nonuniform, the subsequent data read requires a time longer than required. For these reasons, the processing preferably enters the erase sequence of steps S13 and 14.

With reference to FIG. 4(c), in the individual-erase mode, an erase pulse of 0V is applied to a source line SL of a selected memory cell, an erase pulse of 3V is applied to a predetermined word line WL, and a erase pulse of, for example, −5V is applied to a predetermined bit line BL. In this voltage applied state, relatively reverse voltages with respect to those in the program operation shown in FIG. 4(a) are applied, whereby the resistance value of the variable resistor element is reduced. According to this individual-erase mode, erase-programming is performed in units of one bit without erasing the overall memory cell array. In this mode, for an erase-target memory cell 20 in the memory cell array, after voltage application is performed under an application condition of the individual-erase mode, a determination is performed whether the memory cell 20 has been discretely erased. For memory cells already erased, the voltage application under the application condition of the individual-erase mode is stopped for at least the word lines or the bit lines to be connected to the memory cells. For memory cells not yet erased, the voltage application and determination are iterated under the application condition of the individual-erase mode in units of a memory cell until the memory cells are erased. The configuration is preferably made as described above from the viewpoint of reducing the nonuniformity in the resistance values of the variable resistor elements each constituting the memory cell. As a time for erasing one bit, since the erase time is 50 nano seconds and the verify time is 100 nano seconds, a total time of 150 nano seconds is used. According to expression (3) shown below, the time for erasing the 64 Kb block in units of one bit is 78.6 msec, which is longer than the time for the batch erase (6.6 msec, 9.9 msec).

$$150 \text{ ns} \times 64 \text{ Kb} = 78.6 \text{ msec} \tag{3}$$

Thus, in the embodiment, the erase means described above is configured such that, the erase means switches between the batch-erase mode and the individual-erase mode depending on the voltage application conditions in at least one of the memory cell arrays, wherein in the batch-erase mode, the erase means performs batch erase of all the memory cells in the memory cell array; and in the individual-erase mode, the erase means performs individual erase of a part of the memory cells in the memory cell array. However, the erase means may be configured such that, for at least one of the memory cell arrays, the voltage application condition is set to the application condition of the batch-erase mode to enable the erase means to perform batch-erase mode of the all the memory cells in the memory cell array; and for at least other one of the memory cell arrays, individual-erase mode of the voltage application condition is set to the application condition of the individual-erase mode to enable the erase means to perform individual erase of a part of the memory cells in the memory cell array.

The erase means may therefore be appropriately configured to be suitably for, for example, for various use cases depending on the requirements for the semiconductor memory device. Example cases are a use case where a memory cell array needs to be efficiently batch erased to store new updated program data into the erased region, a use case where data needs to be frequently and quickly changed on a bit basis, and a use case where combinations of the above use cases need to be carried out.

Figure 8:
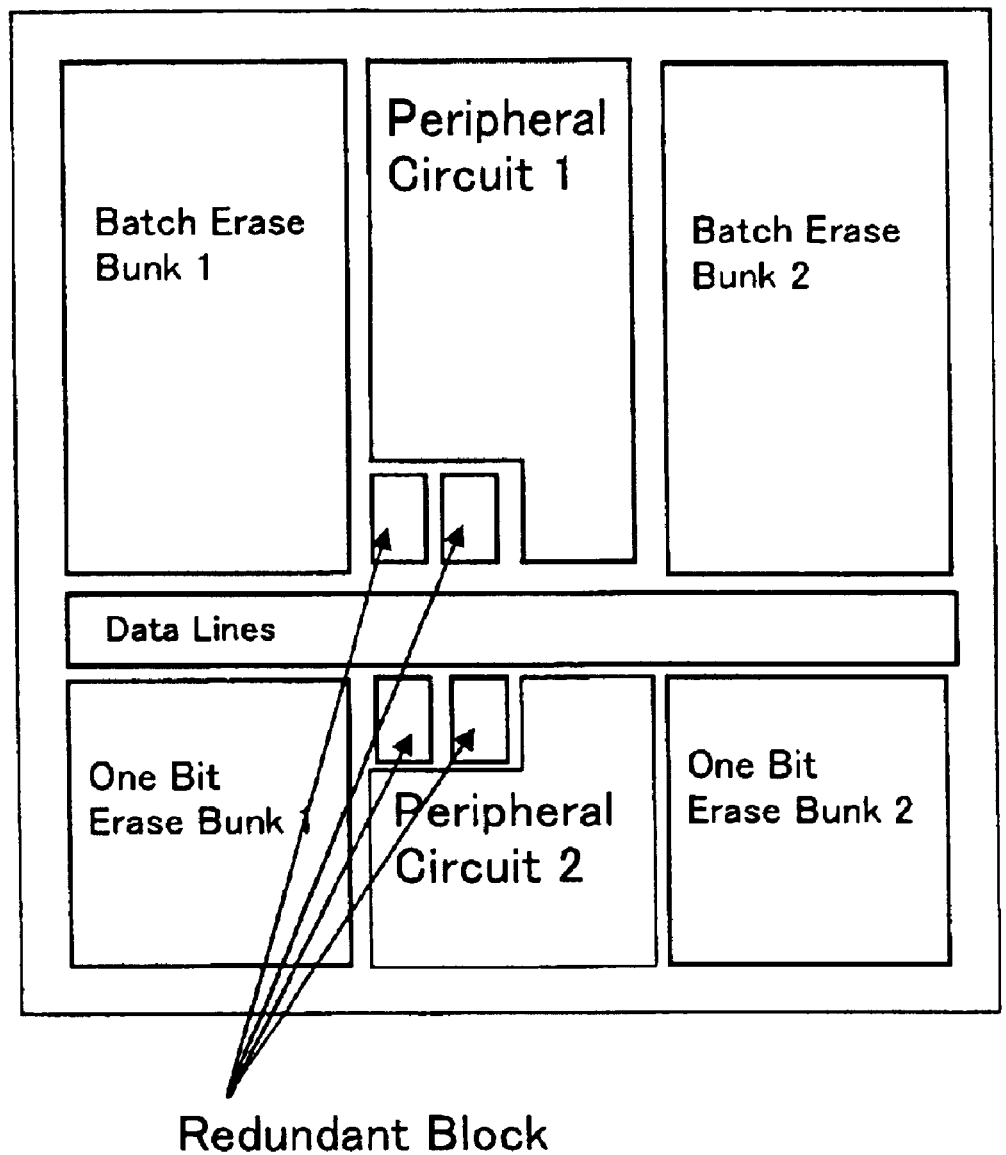
FIG. 8 is a block configuration view showing another embodiment of a memory cell array section configured by using the variable resistor elements that are used in the present invention.
Figure 9:
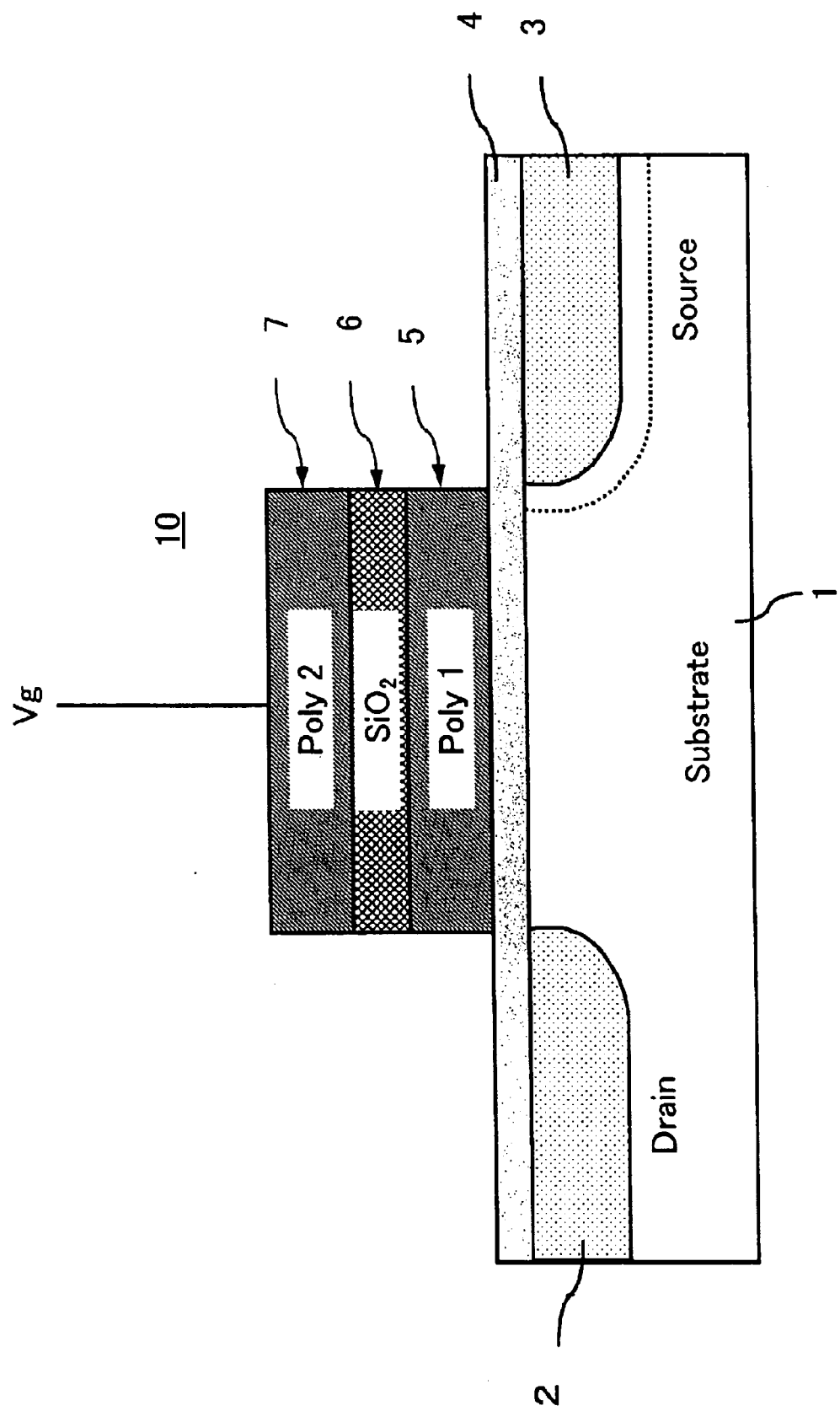
FIG. 9 is a cross-sectional view of an ETOX type memory cell.
Figure 10:
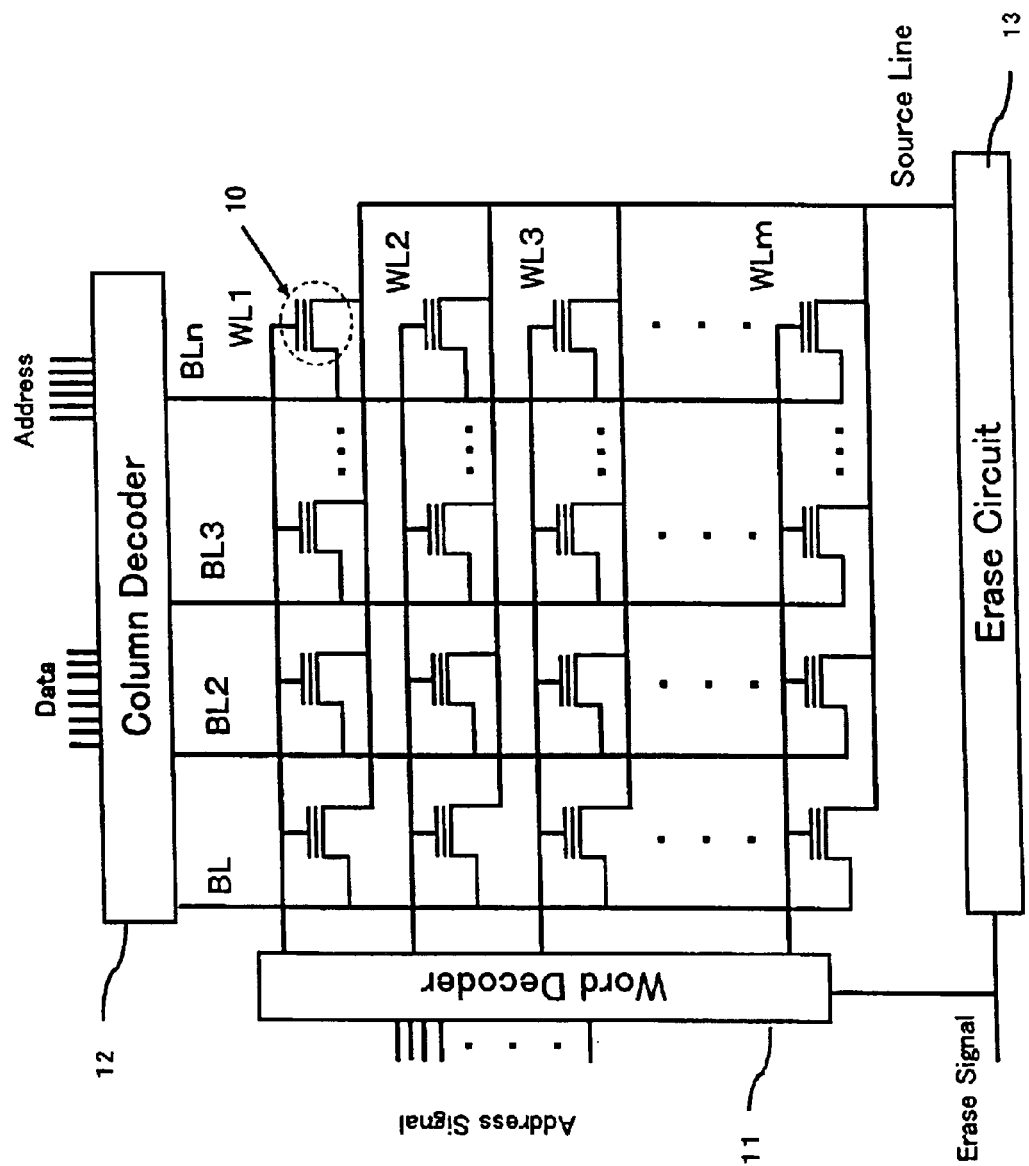
FIG. 10 is a configuration view of a source-common memory cell array section used in a conventional example.
Figure 11:
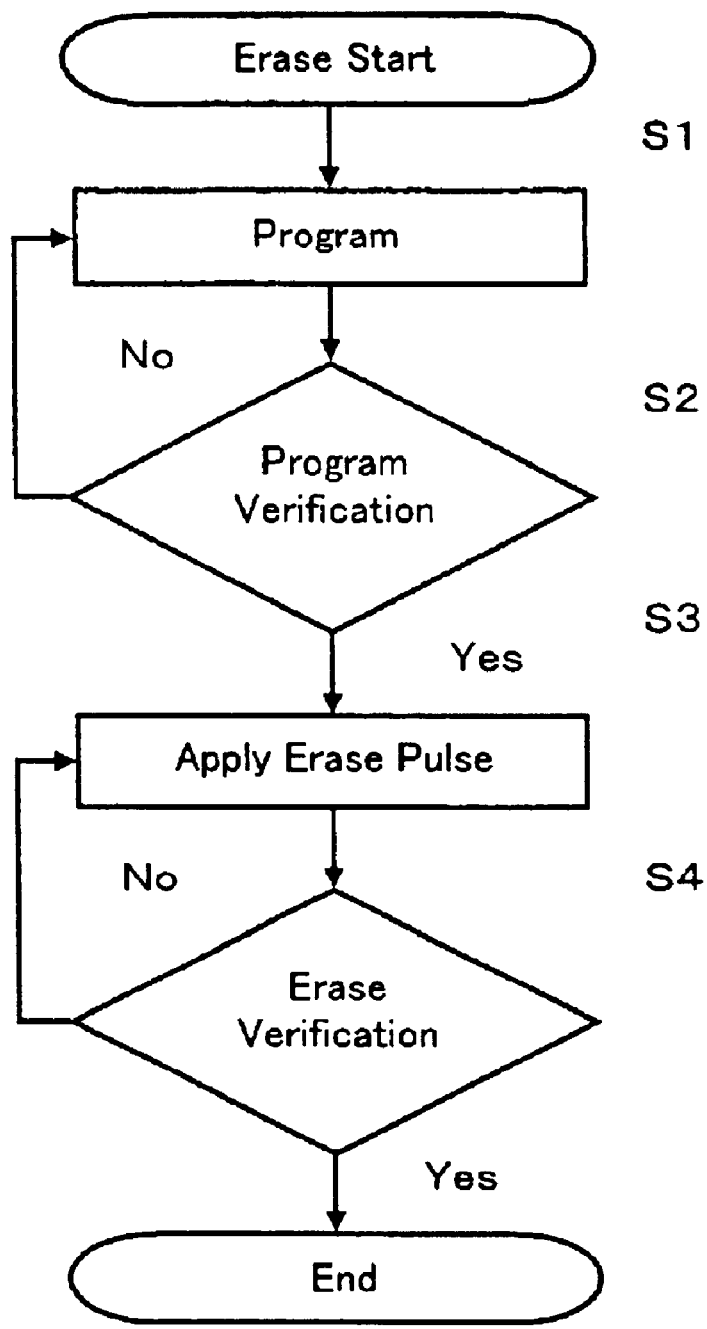
FIG. 11 is a flowchart showing a conventional example of an erase algorithm.

In more detail, using the nonvolatile semiconductor memory device of the present invention, various configurations of the semiconductor memory device and erase methods may be combined and employed to meet requirements of use cases. One example is that, as shown in FIG. 8, the device can be configured to include one-bit erase banks 1 and 2 for erasing an 8M code banks in the individual-erase mode and batch-erase banks 1 and 2 for erasing a 24M data bank in the batch-erase mode. In the configuration shown in the drawing, a peripheral circuit 1 has individual configurations of, for example, a word-line selection circuit corresponding to the batch-erase banks, a program-voltage generation circuit, and a batch-erase circuit that performs erase in the batch-erase mode. In addition, a peripheral circuit 2 has individual configurations of, for example, a word-line selection circuit corresponding to the one-bit erase banks, a bit-erase circuit that performs erase in the individual-erase mode, and a read circuit. Further, redundant blocks are configured in the individual banks to be prepared for memory cells defective in operation.

As another example, the configuration may be arranged as described hereunder. Program means is provided to operate such that voltage is applied under the predetermined application condition to each of the word lines WL, the bit lines BL, and the source line SL that are to be connected to the program-target memory cells in the memory cell array, the electric resistances of the variable resistor elements 24 in the program-target cells in the memory cells 20 are set to a predetermined programmed state, and the information are programmed into the memory cells 20. In this configuration, in the batch-erase mode, before the erase means applies the voltage under the application condition of the batch-erase mode to all the memory cells in the memory cell array, the program means performs the program operation so that the electric resistances of the variable resistor elements are set consistent to a predetermined programmed state for all the memory cells.

Figure 6:
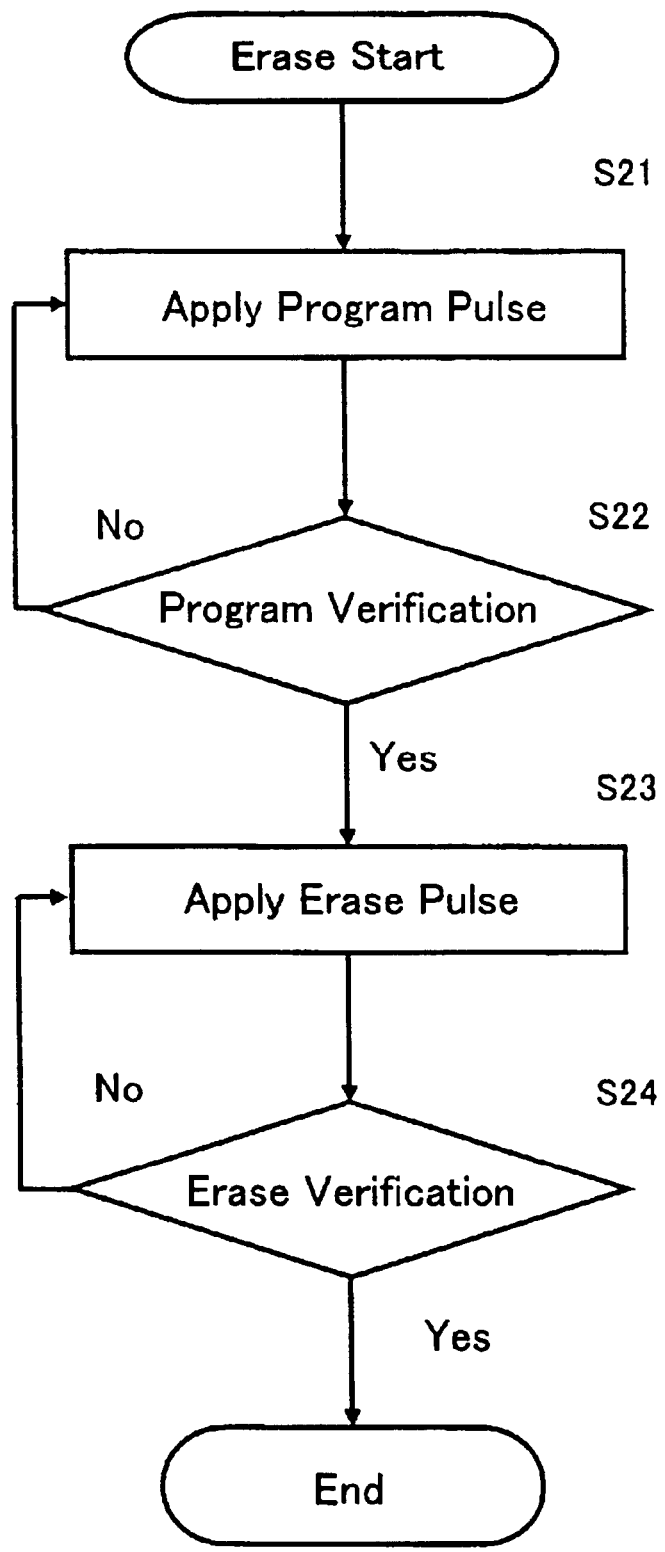
FIG. 6 is a flowchart of an erase method of the memory cell array configured by using the variable resistor elements that are to be used in the present invention.

That is, since the memory cell array also contains cells remaining unprogrammed, when the erase voltage is applied, the current flowing into the unprogrammed cells is increased higher than that flowing to the programmed cells. As such, by once setting the cells to the programmed state, that is, a high resistance state, current dissipation for the erase voltage application can be reduced, and concurrently, resistance-value nonuniformity in the erase mode can be reduced. In more detail, as shown in FIG. 6, a program voltage is applied to a cell in an array or a well (S21). Then, program verify is performed to verify whether all the cells are in a programmed state, and programming and verify are iterated until the cells become the programmed state (S22). Thereafter, as in the erase method, erase voltage application (S23) and erase verify (S24) are performed. In this case, as an erase time, the program time (50 nano seconds per bit) for all the bits in the well is 3.3 msec, the verify time is 6.6 msec, and the total time is therefore 9.9 msec. As such, although the time is increased by about 25%, power consumption is reduced.

Figure 7:
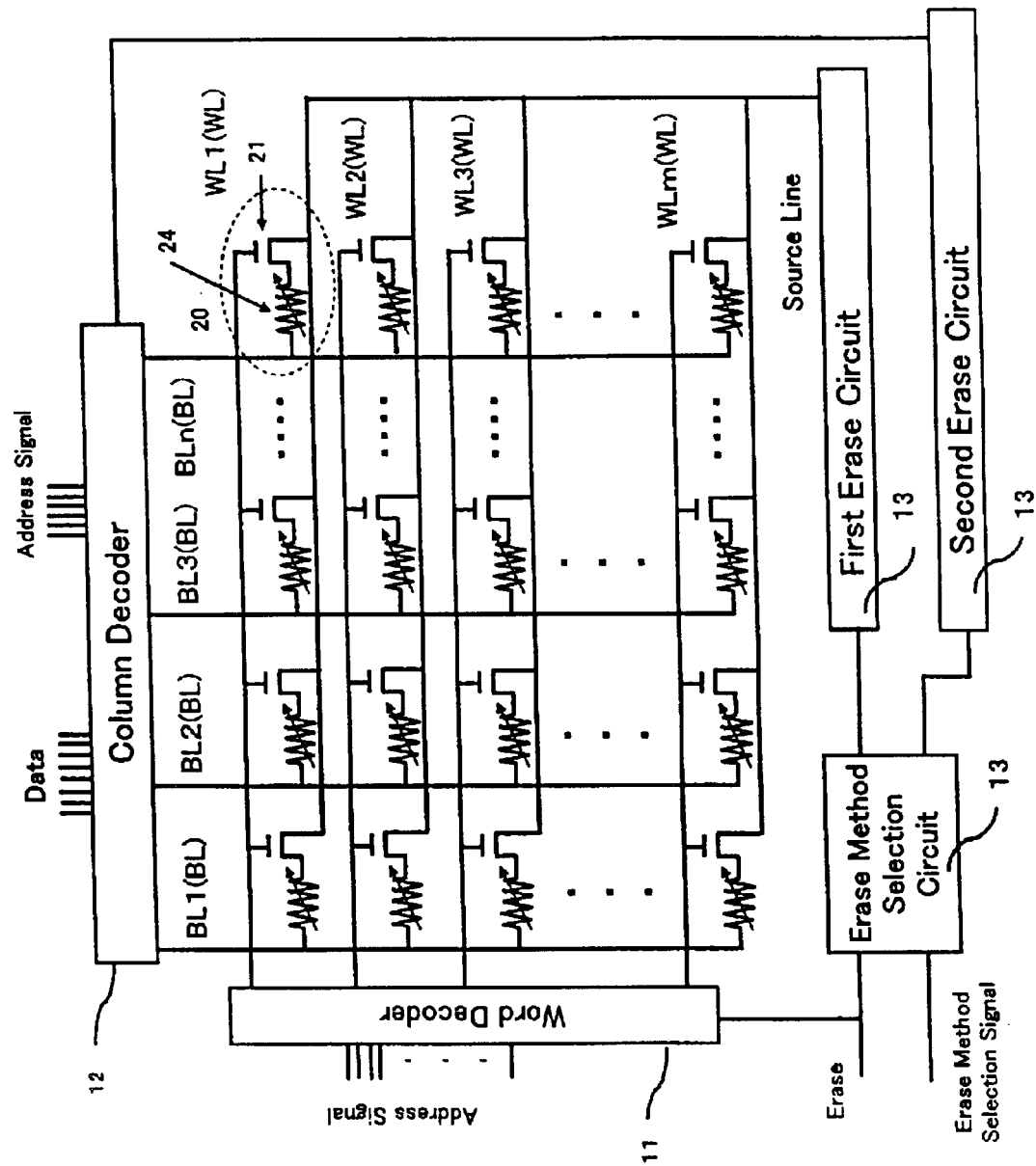
FIG. 7 is a configuration view showing another embodiment of a memory cell array section configured by using the variable resistor elements that are to be used in the present invention.

Thus, the erase circuit 13 has been described with reference to the cases where the batch erase and the 1-bit erase are executed in the voltage application conditions illustrated in FIGS. 4(b) and 4(c). However, as shown in FIG. 7, the configuration may be arranged to include an erase-method selection circuit, a first erase circuit, and a second erase circuit. According to this arrangement, the first erase circuit executes batch erase under the voltage application condition shown in FIG. 4(b). In addition, in the event of 1-bit erase, while the source line SL is being maintained by the first erase circuit at 5V, bit lines BL connected to erase-target memory cells in the memory cells are controlled by the second erase circuit to 0V, and concurrently, bit lines BL connected to non-target memory cells in the memory cells are controlled thereby to 5V, wherein the erase-method selection circuit causes the operations of the first erase circuit and second erase circuit to be switchably operated corresponding erase-method selection signals.

For the variable resistor elements of the type described in the above embodiments, a different type of elements may be used to configure the nonvolatile semiconductor memory device. Examples of the elements are MRAM (magnetic RAM) elements whose resistance value is variable depending on the magnetization direction, and OUM (ovonic unified memory) elements whose resistance value is variable depending on crystalline-state variations caused by crystalline-state change due to heat.

As described above in detail, according to the present invention, the semiconductor memory device and the erase method for a memory cell array can be provided that enable the memory-array selection method to be selected between the batch erase and individual erase modes depending on the use purpose, that are capable of quickly and securely implementing data erase and reprogramming, and that enables power consumption to be reduced.

Although the present invention has been described in terms of the preferred embodiment, it will be appreciated that various modifications and alterations might be made by those skilled in the art without departing from the spirit and scope of the invention. The invention should therefore be measured in terms of the claims which follow.

What is claimed is:

1. A semiconductor memory device comprising:
   a single or a plurality of memory cell arrays; and
   erase means,
   wherein:
   the memory cell array is configured such that a plurality of nonvolatile memory cells each comprising a variable resistor element for storing information through variations in electric resistance are arranged in each of a row direction and a column direction, and a plurality of word lines and a plurality of bit lines are arranged along the row direction and the column direction, respectively, to select a predetermined memory cell or memory cells from the plurality of memory cells;
   the memory cells are arranged such that one end sides of the variable resistor elements are individually connected to drains of selection transistors, the other end sides of the variable resistor elements or sources of the selection transistors are commonly connected to the bit lines along the column direction, the others thereof are commonly connected to the source line, and gates of the selection transistors are commonly connected to the word lines along the row direction; and
   the erase means is configured to apply voltage individually to each of the word lines, the bit cells, and the source line that are connected to the memory cell array under predetermined application conditions, to set the electric resistances of the variable resistor elements in individual erase-target memory cells in the memory cell array to a predetermined erased state, and to thereby render the information in the memory cells to be erasable; and concurrently, the erase means executes the erase by switching between a batch-erase mode and an individual-erase mode depending on the voltage application conditions in at least one of the memory cell arrays, wherein in the batch-erase mode the erase means performs batch erase of all the memory cells in the memory cell array, and in the individual-erase mode the erase means performs individual erase of a part of the memory cells in the memory cell array.

2. The semiconductor memory device according to claim 1, wherein the application conditions of the batch-erase mode and the individual-erase mode are voltage values to be applied to each of the word lines, the bit lines, and the source line.

3. The semiconductor memory device according to claim 1, wherein in the batch-erase mode, for all the memory cells in the memory cell array, the erase means performs operation such that after voltage application is performed under the application condition of the batch-erase mode, a determination is performed whether the individual memory cells have been erased; and if all the memory cells are erased in units of the word line in the row direction, the operation terminates the voltage application in progress under the application condition of the batch-erase mode; and for memory cells not having undergone the erase of all the memory cells in units of the word line in the row direction, the voltage application under the application condition of the batch-erase mode and the determination are iterated for the word lines until all the memory cells are erased in units of the word line in the row direction.

4. The semiconductor memory device according to claim 3, comprising program means for performing operation such that voltages is applied individually under a predetermined application condition to each of the word lines, the bit lines, and the source line that are to be connected to program-target memory cells in the memory cell array, the electric resistances of the variable resistor elements in the program-target memory cells are set to a predetermined programmed state, and the information are programmed into the individual memory cells, wherein in the batch-erase mode, before the erase means applies the voltage under the application condition of the batch-erase mode to all the memory cells in the memory cell array, the program means performs a program operation so that the electric resistances of the variable resistor elements are set consistent to a predetermined programmed state for all the memory cells.

5. The semiconductor memory device according to claim 1, wherein in the individual-erase mode, for an erase-target memory cell in the memory cell array, the erase means performs operation such that after voltage application is performed under the application condition of the individual-erase mode, a determination is performed whether the memory cell has been erased; for the memory cell erased, the operation terminates the voltage application in progress under the application condition of the individual-erase mode to at least one of the word line and the bit line connected to the memory cell erased; and for the memory cell not erased, the voltage application in the application condition of the individual-erase mode and the determination are iterated until the memory cell is erased in units of the memory cell.

6. A semiconductor memory device comprising:
a plurality of memory cell arrays; and
erase means,
wherein:
the memory cell array is configured such that a plurality of nonvolatile memory cells each comprising a variable resistor element for storing information through variations in electric resistance are arranged in each of a row direction and a column direction, and a plurality of word lines and a plurality of bit lines are arranged along each of the row direction and column direction, respectively, to select a predetermined memory cell or memory cells from the plurality of memory cells;

the memory cells are arranged such that one end sides of the variable resistor elements are individually connected to drains of selection transistors, the other end sides of the variable resistor elements or sources of the selection transistors are commonly connected to the bit lines along the column direction, the others thereof are commonly connected to the source line, and gates of the selection transistors are commonly connected to the word lines along the row direction; and the erase means is configured to apply voltage individually to each of the word lines, the bit cells, and the source line that are connected to the memory cell array under predetermined application conditions, to set the electric resistances of the variable resistor elements in individual erase-target memory cells in the memory cell array to a predetermined erased state, and to thereby render the information in the memory cells to be erasable;

the erase means is configured such that for at least one of the memory cell arrays, the erase means renders all the memory cells in the memory cell array to be erasable in batch by setting the application condition of the voltage to the application condition of the batch-erase mode; and the erase means is configured such that for at least other one of the memory cell arrays, the erase means renders a part of the memory cells in the memory cell array to be individually erasable by setting the application condition of the voltage to the application condition of the individual-erase mode.

7. The semiconductor memory device according to claim 6, wherein the application conditions of the batch-erase mode and the individual-erase mode are voltage values to be applied to each of the word lines, the bit lines, and the source line.

8. The semiconductor memory device according to claim 6, wherein in the batch-erase mode, for all the memory cells in the memory cell array, the erase means performs operation such that after voltage application is performed under the application condition of the batch-erase mode, a determination is performed whether the individual memory cells have been erased; and if all the memory cells are erased in units of the word line in the row direction, the operation terminates the voltage application in progress under the application condition of the batch-erase mode; and for memory cells not having undergone the erase of all the memory cells in units of the word line in the row direction, the voltage application under the application condition of the batch-erase mode and the determination are iterated for the word lines until all the memory cells are erased in units of the word line in the row direction.

9. The semiconductor memory device according to claim 8, comprising program means for performing operation such that voltages is applied individually under a predetermined application condition to each of the word lines in the memory cell array, the bit lines, and the source line that are to be connected to program-target memory cells, the electric resistances of the variable resistor elements in the program-target memory cells are set to a predetermined programmed state, and the information are programmed into the individual memory cells, wherein in the batch-erase mode, before the erase means applies the voltage under the application condition of the batch-erase mode to all the memory cells in the memory cell array, the program means performs a program operation so that the electric resistances of the variable resistor elements are set consistent to a predetermined programmed state for all the memory cells.

10. The semiconductor memory device according to claim 6, wherein in the individual-erase mode, for an erase-target memory cell in the memory cell array, the erase means performs operation such that after voltage application is performed under the application condition of the individual-erase mode, a determination is performed whether the memory cell has been erased; for the memory cell erased, the operation terminates the voltage application in progress under the application condition of the individual-erase mode to at least one of the word line and the bit line connected to the memory cell erased; and for the memory cell not erased, the voltage application in the application condition of the individual-erase mode and the determination are iterated until the memory cell is erased in units of the memory cell.

11. An erase method for a memory cell array of a semiconductor memory device, wherein:

the semiconductor memory device comprises a single or a plurality of memory cell arrays each configured such that a plurality of nonvolatile memory cells each comprising a variable resistor element for storing information through variations in electric resistance are arranged in each of a row direction and a column direction, and a plurality of word lines and a plurality of bit lines are arranged in the row direction and the column direction, respectively, to select a predetermined memory cell or memory cells from the plurality of memory cells;

the memory cells are arranged such that one end sides of the variable resistor elements are individually connected to drains of selection transistors, the other end sides of the variable resistor elements or sources of the selection transistors are commonly connected to the bit lines along the column direction, the others thereof are commonly connected to the source line, and gates of the selection transistors are commonly connected to the word lines along the row direction;

the erase method comprises a batch-erase mode and a individual-erase mode, wherein the batch-erase mode is used to perform batch erase of all the memory cells in the memory cell array in units of the memory cell array, and the individual-erase mode is used to perform individual erase of a part of the memory cells in the memory cell array;

in each the batch-erase mode and the individual-erase mode, the erase method applies voltage individually to each of the word lines, the bit cells, and the source line that are connected to the memory cell array under predetermined application conditions, sets the electric resistances of the variable resistor elements in individual erase-target memory cells in the memory cell array to a predetermined erased state, and thereby erases the information in the memory cells; and the application condition of the batch-erase mode and the application condition of the individual-erase mode are different in an application condition at least for one of the word line, the bit line, and the source line.

12. The erase method according to claim 11, wherein in the batch-erase mode, for all the memory cells in the memory cell array, the erase method performs operation such that after voltage application is performed under the application condition of the batch-erase mode, a determination is performed whether the individual memory cells have been erased; and if all the memory cells are erased in units of the word line in the row direction, the operation terminates the voltage application in progress under the application condition of the batch-erase mode; and for memory cells not having undergone the erase of all the memory cells in units of the word line in the row direction, the voltage application under the application condition of the batch-erase mode and the determination are iterated for the word lines until all the memory cells are erased in units of the word line in the row direction.

13. The erase method according to claim 12, wherein in the batch-erase mode, before applying the voltage under the application condition of the batch-erase mode to all the memory cells in the memory cell array, the erase method performs a program operation so that the electric resistances of the variable resistor elements are set consistent to a predetermined programmed state for all the memory cells.

14. The erase method according to claim 11, wherein in the individual-erase mode, for an erase-target memory cell in the memory cell array, the erase method performs operation such that after voltage application is performed under the application condition of the individual-erase mode, a determination is performed whether the memory cell has been erased; for the memory cell erased, the operation terminates the voltage application in progress under the application condition of the individual-erase mode to at least one of the word line and the bit line connected to the memory cell erased; and for the memory cell not erased, the voltage application in the application condition of the individual-erase mode and the determination are iterated until the memory cell is erased in units of the memory cell.

* * * * *